United States Patent [19]
Hwang et al.

[11] Patent Number: 6,157,867
[45] Date of Patent: Dec. 5, 2000

[54] METHOD AND SYSTEM FOR ON-LINE MONITORING PLASMA CHAMBER CONDITION BY COMPARING INTENSITY OF CERTAIN WAVELENGTH

[75] Inventors: Yuan-Ko Hwang, Hualien; Ching-Wen Cho, Nan Tou, both of Taiwan

[73] Assignee: Taiwan Semiconductor Manufacturing Company, Hsin-Chu, Taiwan

[21] Appl. No.: 09/031,654

[22] Filed: Feb. 27, 1998

[51] Int. Cl.[7] ................................... G06F 19/00
[52] U.S. Cl. .................. 700/121; 700/266; 216/60; 216/67
[58] Field of Search ............. 156/345; 204/298.03, 204/298.32; 216/59, 60, 67; 356/316; 438/9; 700/121, 266, 117; 702/31

[56] References Cited

U.S. PATENT DOCUMENTS

| | | | |
|---|---|---|---|
| 4,242,188 | 12/1980 | Niinomi et al. | 204/164 |
| 4,846,928 | 7/1989 | Dolins et al. | 438/16 |
| 4,861,419 | 8/1989 | Flinchbaugh et al. | 216/59 |
| 5,014,217 | 5/1991 | Savage | 702/28 |
| 5,347,460 | 9/1994 | Gifford et al. | 364/468 |
| 5,405,488 | 4/1995 | Dimitrelis et al. | 216/60 |
| 5,546,322 | 8/1996 | Gifford et al. | 364/497 |
| 5,661,669 | 8/1997 | Mozumder et al. | 364/552 |
| 5,711,843 | 1/1998 | Jahns | 156/345 |
| 5,759,424 | 6/1998 | Imatake et al. | 216/60 |

*Primary Examiner*—William Grant
*Assistant Examiner*—Steven R. Garland
*Attorney, Agent, or Firm*—George O. Saile; Stephen B. Ackerman; Graham S. Jones, II

[57] ABSTRACT

A method for operating a plasma processing system comprises the following steps. Produce a plasma in a plasma processing chamber operating upon a selected workpiece. Perform in situ detection of electromagnetic radiation of a certain wavelength generated in the plasma in the plasma processing chamber. Calculate a first intensity difference of the certain wavelength from a set point of intensity. Halt production of the plasma in the plasma processing chamber if the first intensity difference is outside of specifications.

14 Claims, 6 Drawing Sheets

METHOD AND SYSTEM FOR ON-LINE MONITORING PLASMA CHAMBER CONDITION BY COMPARING INTENSITY OF CERTAIN WAVELENGTH

BACKGROUND OF THE INVENTION

1. Field of the Invention

This invention relates to methods of automatic control in plasma processing and more particularly to process control of plasma manufacturing with a computer control system for manufacture of products such as integrated circuit semiconductor devices.

2. Description of Related Art

Plasma processing technologies which are practiced in plasma chambers have been widely used in IC (Integrated Circuit) manufacturing processes. For example, plasma etching, Chemical Vapor Deposition (CVD), and sputtering processes have been used.

U.S. Pat. No. 5,347,460 of Gifford et al. for "Method and System Employing Optical Emission Spectroscopy for Monitoring and Controlling Semiconductor Fabrication" shows a method and system employing Optical Emission Spectroscopy (OES) for monitoring and controlling flow rates of gases in a semiconductor fabrication process; generally discussing on-line controlling plasma processes by OES using very specific control rules as well as general control rule principles.

U.S. Pat. No. 5,661,669 of Mozumder et al. shows a "Method for Controlling Semiconductor Wafer Processing" that relates to a process control system which includes use of an in situ optical sensor such as a monochromator for measuring process parameters during semiconductor wafer fabrication/processing. For example, the monochromator can generate a signal proportional to the concentration of a predetermined chemical species in a processing unit. The system is adapted to be used for run-to-run control of semiconductor wafer processing by comparing a measured quality characteristic with an expected quality characteristic.

U.S. Pat. No. 5,546,322 of Gifford et al. for "Method and System for Analyzing Plasma Data" shows control rules and a system for analyzing plasma data. Analysis of plasma data indicative of gaseous species therein, such as Optical Emission Spectroscopy (OES) data, is aided through the interactive use of a computer.

U.S. Pat. No. 4,242,188 of Niinomi et al. for "Method for Controlling Plasma Chemical Reactions" shows a method for controlling plasma chemical reactions by plasma constants. The plasma constants in the progress of reaction such as electron temperature, electron density and electron energy distribution function can be measured by use of a probe heated to a high temperature which is made of a metal having a small thermionic electron emission at a high temperature. The plasma chemical reaction can be performed in the steady state with satisfactory reproduction of composition, structure, yield and performance of the product by controlling the pressure, input power and gas flow rate in the plasma reactor so that the measured plasma constants always coincide with the predetermined plasma constants necessary for effecting the intended chemical reaction which have been obtained through a preliminary experiment.

SUMMARY OF THE INVENTION

An object of this invention is to reduce possible impact on production of products in a plasma processing system by abnormal chamber or process conditions. This is particularly directed to manufacture of semiconductor integrated circuits on silicon wafers.

Another object of this invention is to avoid possible chamber or equipment damage caused by unstable plasma conditions.

In accordance with this invention, a method of on-line monitoring of chamber condition involves steps for observation of plasma stability as follows:

1) In situ calculation of the intensity difference (when processing wafers) for a certain electromagnetic wavelength which is generated by the plasma process.

If the intensity difference falls outside of a certain threshold, the plasma chamber or process is considered to be in an abnormally poor condition of operation and the plasma process is halted immediately.

(2) the control rules rules for calculating intensity difference include (A). Wafer to set point comparison.

(B). Wafer to wafer comparison.

In accordance with this invention, a method and system for operating a plasma processing system includes production of a plasma in a plasma processing chamber operating upon a selected workpiece; in situ detecting of electromagnetic radiation of a certain wavelength generated in the plasma in the plasma processing chamber; calculating a first intensity difference of the certain wavelength from a set point of intensity, and halting production of the plasma in the plasma processing chamber if the first intensity difference is outside of specifications.

Preferably there is wafer to set point comparison:

$$E_n(t) = I_n(t) - C(t), n=1, 2,$$

where t is the time parameter, which can be a constant $E_n(t)$ is the nth intensity difference $I_n(t)$ is the monitored intensity of nth (current) processing workpiece, and C(t) is set point of intensity Preferably, the method and system retrieve intensity set point data, collect workpiece intensity data, determine the current workpiece vs. set point intensity difference by comparing intensity data to set point data, test whether the intensity difference is outside of specifications for intensity, and if YES, halt production of the plasma in the plasma processing chamber.

Preferably, the method and system calculate a relative intensity difference of the certain wavelength with respect to intensities at the certain wavelength of other workpieces, and halt production of the plasma in the plasma processing chamber if the additional intensity difference is outside of specifications.

The method and system provide wafer to workpiece comparison (within lot):

$$E_k(t) = I_n(t) - I_k(t), n=1, 2, 3, \ldots, k=1, 2, \ldots, n$$

where $E_n(t)$ are the 1, 2, . . . , nth, relative intensity differences $I_n(t)$ is the monitored intensity of the nth (current) processing workpiece, and $I_k(t)$ are the intensities of the 1, 2, . . . , nth processing workpieces.

Preferably, the method and system retrieve previous workpiece intensity data, retrieving current workpiece intensity data, determine the relative intensity difference by comparing the current workpiece with previous workpiece intensity data, test whether the relative intensity difference is outside of specifications for relative intensity difference, and if YES, halt production of the plasma in the plasma processing chamber.

Preferably, the method and system perform the determination of relative intensity difference for each of a set of previous workpieces until the set of previous workpieces is exhausted.

In another aspect of the invention, the method and system perform the following:

retrieve intensity set point data, collect current workpiece intensity data, determine the current workpiece vs set point intensity difference by comparing the current workpiece intensity data to the intensity set point data, test whether the intensity difference is outside of specifications for intensity and if YES, halt production of the plasma in the plasma processing chamber, if NO, store the current workpiece intensity data and then retrieving previous workpiece intensity data, retrieving current workpiece intensity data, determine the relative intensity difference by comparing the current workpiece with previous workpiece intensity data, test whether the relative intensity difference is outside of specifications for relative intensity difference, and if YES, halt production of the plasma in the plasma processing chamber.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Stability of a plasma conditions in plasma processing chambers can be observed by monitoring the intensity of certain wavelengths, created by the plasma gases in the plasma chambers. The intensity of those certain wavelengths indicates the of status the plasma. As a practical matter, the plasmas produced are either stable or in a stable process of change during processing in the plasma chamber. Any significant change of the intensity of certain indicator wavelengths is considered to be indicative of an abnormal change in the condition of the chamber or the process conditions of the plasma in the chamber. For example, such changes in the intensity of certain indicator wavelengths can result from factors as the follows:

1) installation of a wrong part into the chamber during maintenance, 2) poor gas or pressure control, 3) leakage, 4) unstable RF (Radio Frequency) matching, 5) gas impurities, 6) poor transfer, 7) particle on electrode, etc.

By on-line monitoring of intensity differences, we can discern whether the plasma chamber is under normal or abnormal condition and thus takes necessary corrective actions to avoid hundreds of scrapped wafers.

Plasma technology has been widely used in IC manufacturing processes, including etching, CVD, and sputtering processes. One of important characteristics of a plasma processing system is ionization of a plasma gas by RF power. The ionized gases release different spectra for which the intensity of a specific characteristic wavelengths can be used to decide when the plasma process should ended or not. For example, the intensity of the CO (Carbon Monoxide) wavelength (483.5 nm) is monitored during $SiO_2$ etching for ending the etching process (the time is known as "endpoint time (E/P)").

However, the endpoint is affected by the rate of change of the intensity of radiation at the specific characteristic wavelength. During an unstable plasma process, the intensity may change abruptly, which directly induces an incorrect indication of when the endpoint has been reached, or results in a poor etching process. The unstable plasma is undesirable and should be detected as early as possible.

There are many possible factors affecting the stability of a plasma. Examples of factors affecting the stability of a plasma are leakage, wrong chamber parts, a poor RF match unit, unstable gas/pressure control, poor transfer, unwanted particles on electrode or others.

All of these factors are not easily detected, but they may induce huge production (wafer) scrap.

The present invention provides a tool for monitoring chamber conditions by employing means for observing plasma stability in combination with means for on-line calculation of the intensity difference for each wafer being processed. If any significant intensity difference is found or out of certain threshold during process, a warning is provided and equipment is halted for more detail check.

Figure 1:
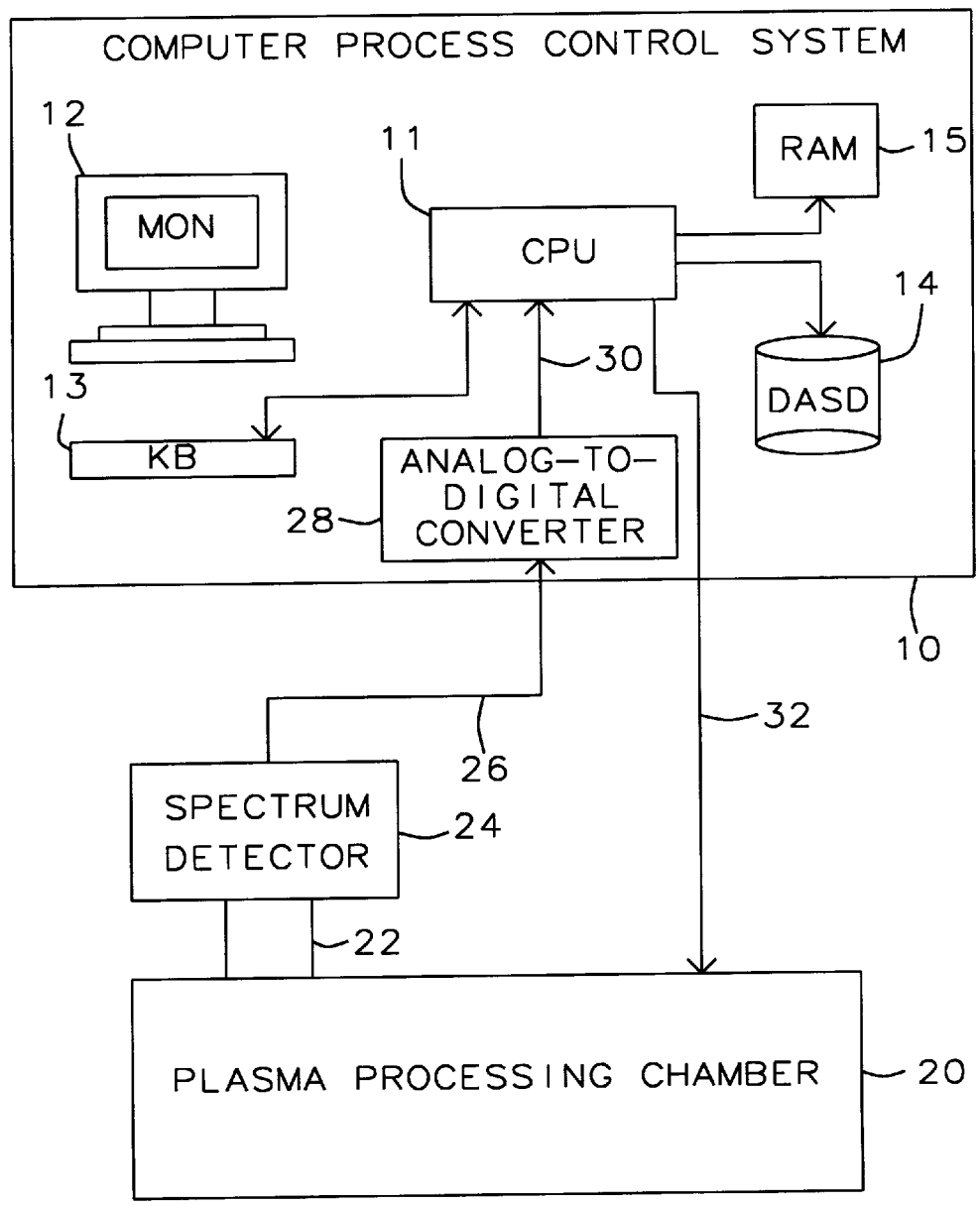
FIG. 1 shows an embodiment of the overall system of this invention including a plasma processing chamber, a spectrum detector and a computer which includes and analog-to-digital (A/D) converter.

FIG. 1 shows an embodiment of the overall system of this invention. A conventional plasma processing chamber 20 is shown which includes means for generating a plasma including an RF plasma generating system. The system including plasma processing chamber 20 can be employed for plasma etching, CVD, or sputtering processes. Different processes produce characteristic electromagnetic radiation wavelengths.

A spectrum detector 24 is connected to chamber 20 at a window 22 in the walls of the chamber which permits the detector to receive radiation from the plasma generated in chamber 20. Spectrum detector 24 is capable of detecting the intensity of a specific characteristic electromagnetic radiation wavelength.

The spectrum detector 24 distinguishes specific characteristic electromagnetic radiation wavelengths from other wavelengths passing through window 22 with the spectrum detector 24 which uses optical filters such as passband filters. The characteristics that are supplied to the A/D converter in are from 0 to about 15 Volts and from 0 about 32,700 counts.

Spectrum detector 24 has an output connection line 26 providing analog signals to a computer 10 (microprocessor) with an A/D converter 28 which provides digital output to the CPU (Central Processing Unit) 11 in computer 10. The computer 10 also includes a monitor 12 connected to receive displays from CPU 11, a keyboard 13 for supplying input to the CPU 11. A Random Access Memory (RAM) 15 and a Direct Access Storage Device (DASD) 14 such as a disk drive are connected to send and receive data to and from CPU 11.

The CPU 11 calculates the intensity difference with specific control rules which are described below with reference to the flow chart shown in FIGS. 2A and 2B. The CPU 11 can halt the process chamber or equipment when parameters are outside of acceptable limits as is explained below in connection with FIGS. 2A and 2B.

The control rules for calculating intensity difference are as follows:

(a) First rule:
Wafer to set point comparison:

$$E_n(t)=I_n(t)-Ct, n=1, 2,$$

where: t is the time parameter, which can be a constant $E_n(t)$ is the nth intensity difference $I_n(t)$ is the monitored intensity of nth (current) processing wafer $C(t)$ is set point of intensity With the first control rule, the intensity of each processing wafer is compared to an absolute value. If the intensity difference is out of specification, processing chamber or equipment are halted immediately. The comparison period and revolution are controlled by the time parameter of "t", which can be a constant.

(b) Second rule:
Wafer to wafer comparison (within lot):

$$E_k(t)=I_n(t)-I_k(t), n=1, 2, 3, \ldots, k=1, 2, \ldots, n$$

where: $E_k(t)$ are the 1, 2, . . . , nth, relative intensity differences $I_n(t)$ is the monitored intensity of the nth (current) processing wafer $I_k(t)$ are the intensities of the 1, 2, . . . , nth processing wafers With the second rule, the relative intensity when processing a wafer is compared to former intensity of each previous wafer in a lot. For example, the relative intensity of the 5th processing wafer is compared to the intensities of 1, 2, 3, and 4th wafers. Chamber or equipment processing is halted if one of these relative intensity differences is out of specification. Again the time parameter of "t" is adjustable based on desired revolution.

Figure 3:
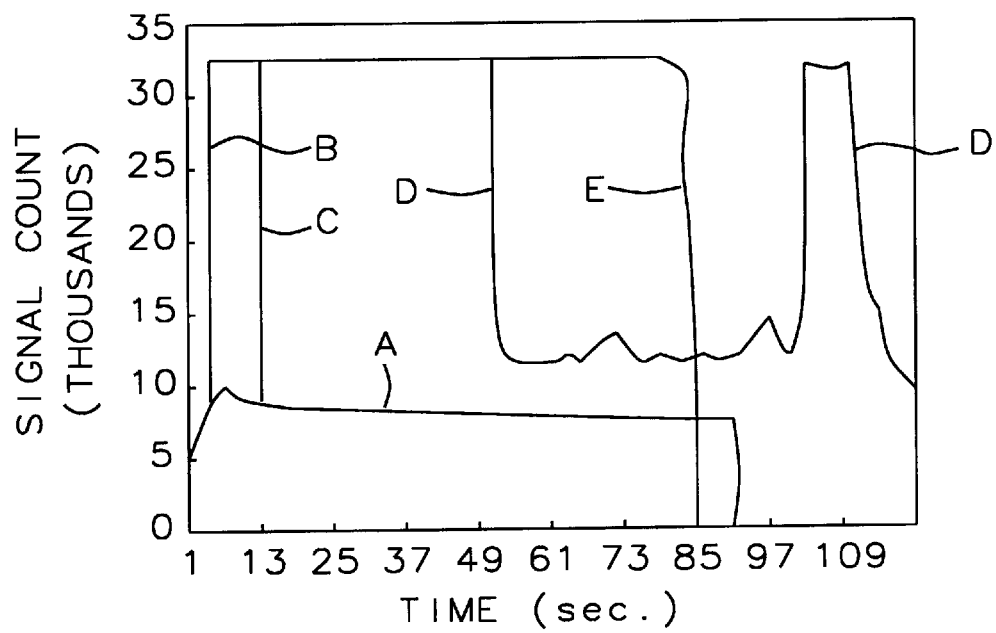
FIG. 3 shows a chart of Intensity Comparison of Silicon Dioxide Etching with a vertical axis of signal count as a function of time.
Figure 4:
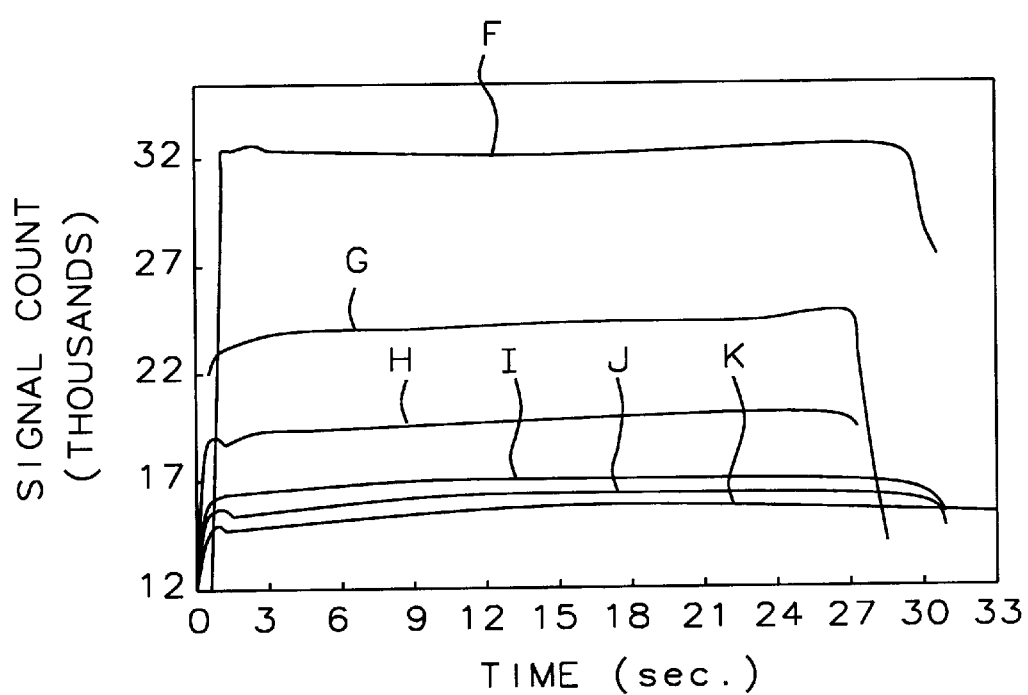
FIG. 4 shows a chart of intensity comparison of silicon nitride etching with a vertical axis of signal count as a function of time.

FIGS. 3 and 4 show that the invention successfully catches a few abnormal chamber conditions of Nitride ($Si_3N_4$) and Oxide ($SiO_2$) etching processes.

Figure 2A:
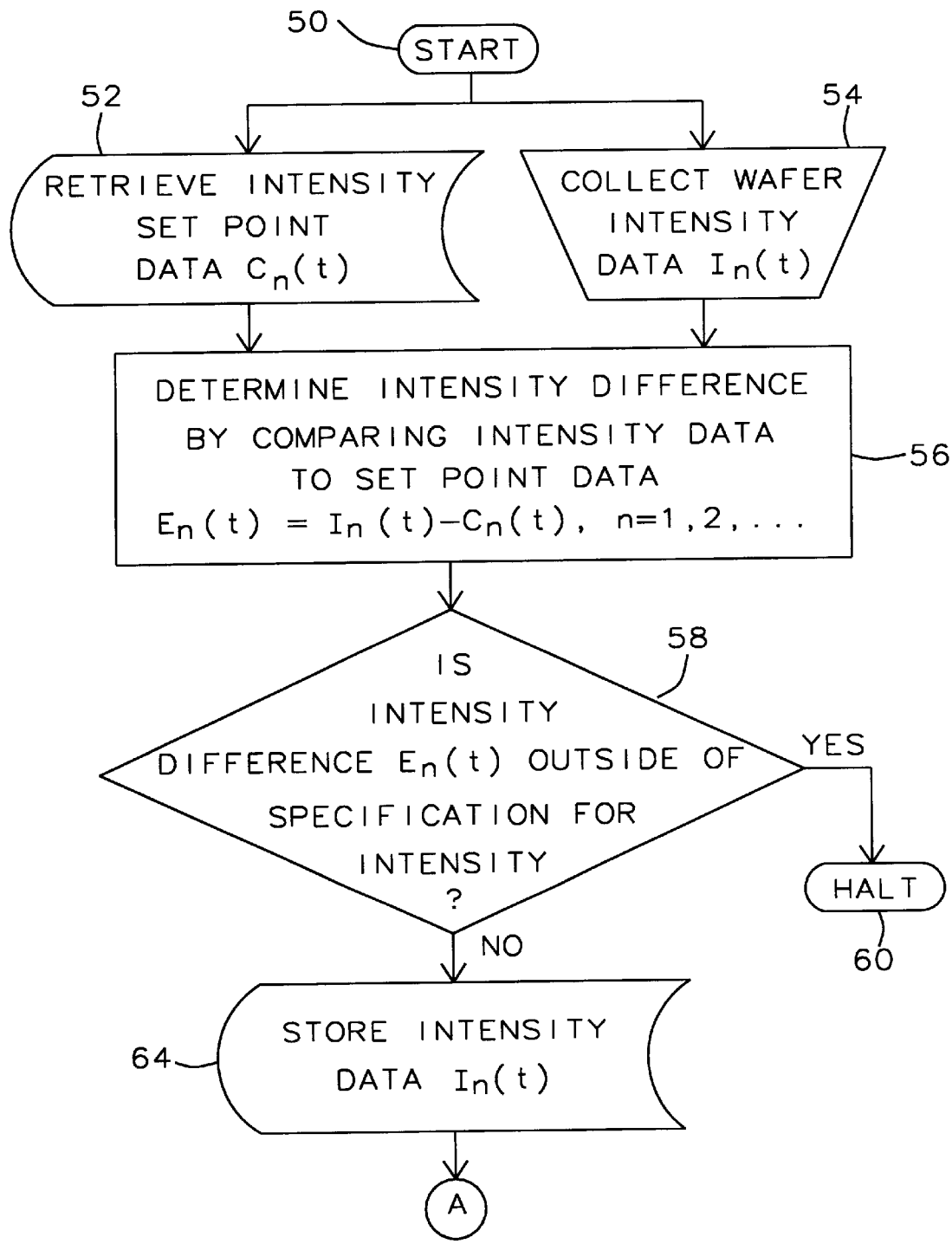
FIGS. 2A and 2B show a flow chart for operating the computer of FIG. 1 to perform the system and method of this invention in accordance with specific control rules.

FIG. 2A shows the flow chart for the programming routine used to operate computer 10 of FIG. 1 in accordance with this invention. The program starts with step 50.

The program begins in step 52 to retrieve intensity set point data $C_n(t)$. Simultaneously, the program performs step 54 to collect wafer intensity data $I_n(t)$ from the spectrum detector 24. In step 56, the program operates CPU 11 to determine the intensity difference by comparing intensity data to set point data in accordance with the equation:

$$E_n(t)=I_n(t)-C_n(t), n=1,2, \ldots$$

Next, as defined in block 58, the CPU 11 tests to determine intensity difference $E_n(t)$ outside specifications for intensity? If, YES, the CPU 11 sends a signal on line 32 directing the automatic plasma processing chamber 20 to HALT processing as indicated by block 60.

Figure 2B:
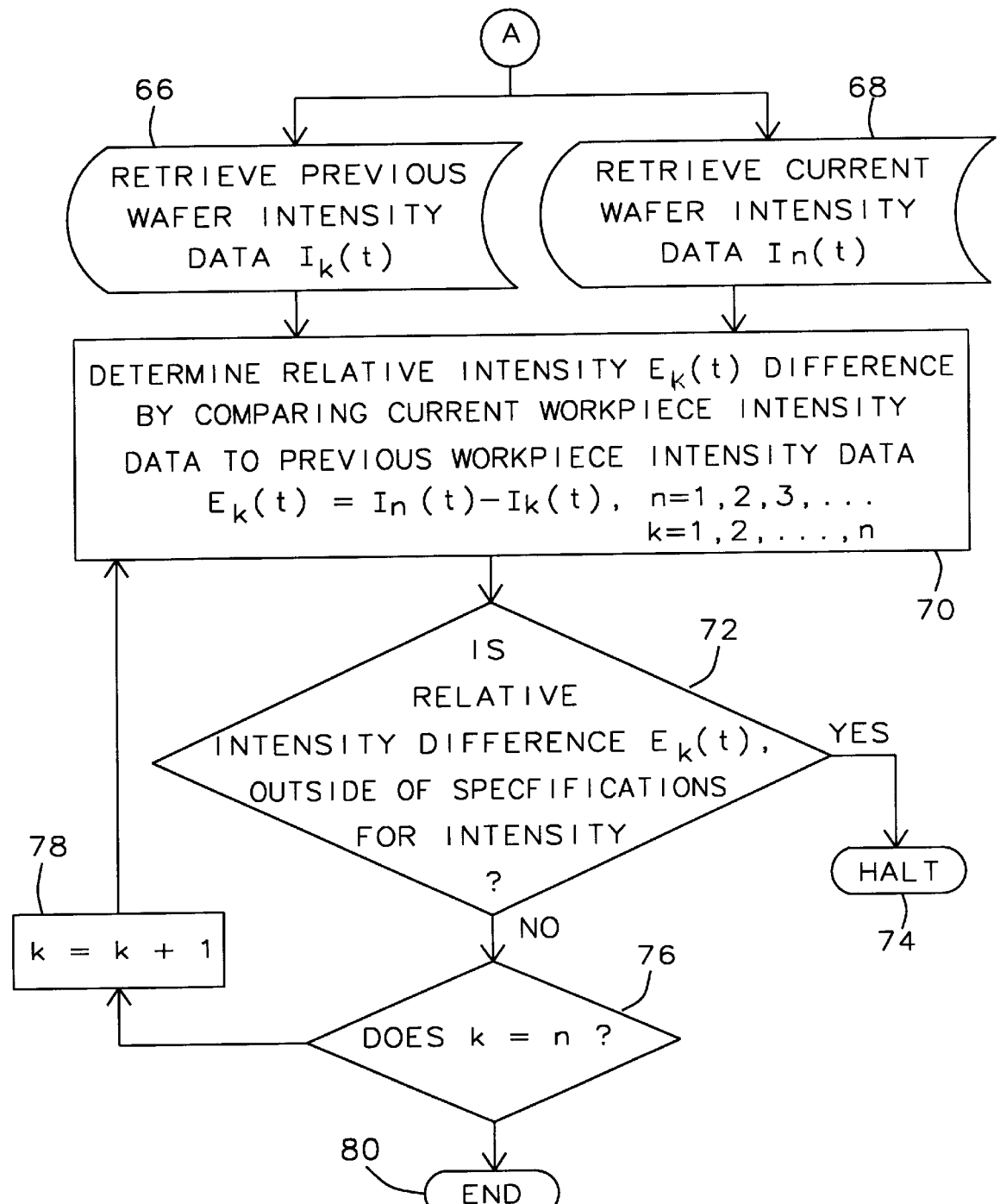

In block 64, if the result of the test in block 58 is NO, then the CPU stores the intensity data $I_n(t)$ in the DASD 14 and proceeds as indicated by connector A to steps 66 and 68 in FIG. 2B.

In FIG. 2B, is step 66 the CPU 11 retrieves previous wafer intensity data $I_k(t)$, and in step 68 CPU 11 retrieves current wafer intensity data $I_n(t)$. In step 70, the CPU 11 determines the relative intensity difference within a lot by comparing the current intensity data $I_n(t)$ to previous intensity data $I_k(t)$ as follows:

$$E_k(t)=I_n(t)-I_k(t), n=1,2,3, \ldots, k=1,2, \ldots, n$$

Next, in test 72, the question is whether the difference $E_k(t)$, within the lot, falls outside the specifications for intensity?

If YES, then in block 74, the signal is generated by CPU 11 to the plasma chamber 20 to HALT processing.

If NO, then in block 76, the test is made whether the value "k" is equal to "n". If YES, then in block 80, the routine of FIGS. 2A and 2B is at an END.

If NO, then in block 78, the CPU 11 increments the variable "k" by "1" to equal "k+1", and the program loops back to step 70 until the test in block 76 results in a YES and the routine ends.

FIG. 3 shows a chart of Intensity Comparison of Silicon Dioxide ($SiO_2$) Etching with a vertical axis of signal count (thousands) vs. time (seconds). The normal chamber condition, stable plasma is indicated by trace A. On the other hand lines B, C, D, and E are indicative of an unstable plasma. This makes it possible to catch abnormal chamber operating conditions.

FIG. 4 shows a chart of intensity comparison of silicon nitride ($Si_3N_4$) etching with a vertical axis of signal count (thousands) vs. time (seconds). Curve F is for a chamber L/R=100–150 mt/minute, local under etch. Curve G is for a chamber L/R=10–20 mt/minute comprising a normal chamber condition. Curve H is for a particle on the lower electrode, local under etch. Curves I, J, and K are for a robot shift, wafer not on lower electrode, local under etch. This makes it possible to catch abnormal chamber operating conditions.

Figure 5:
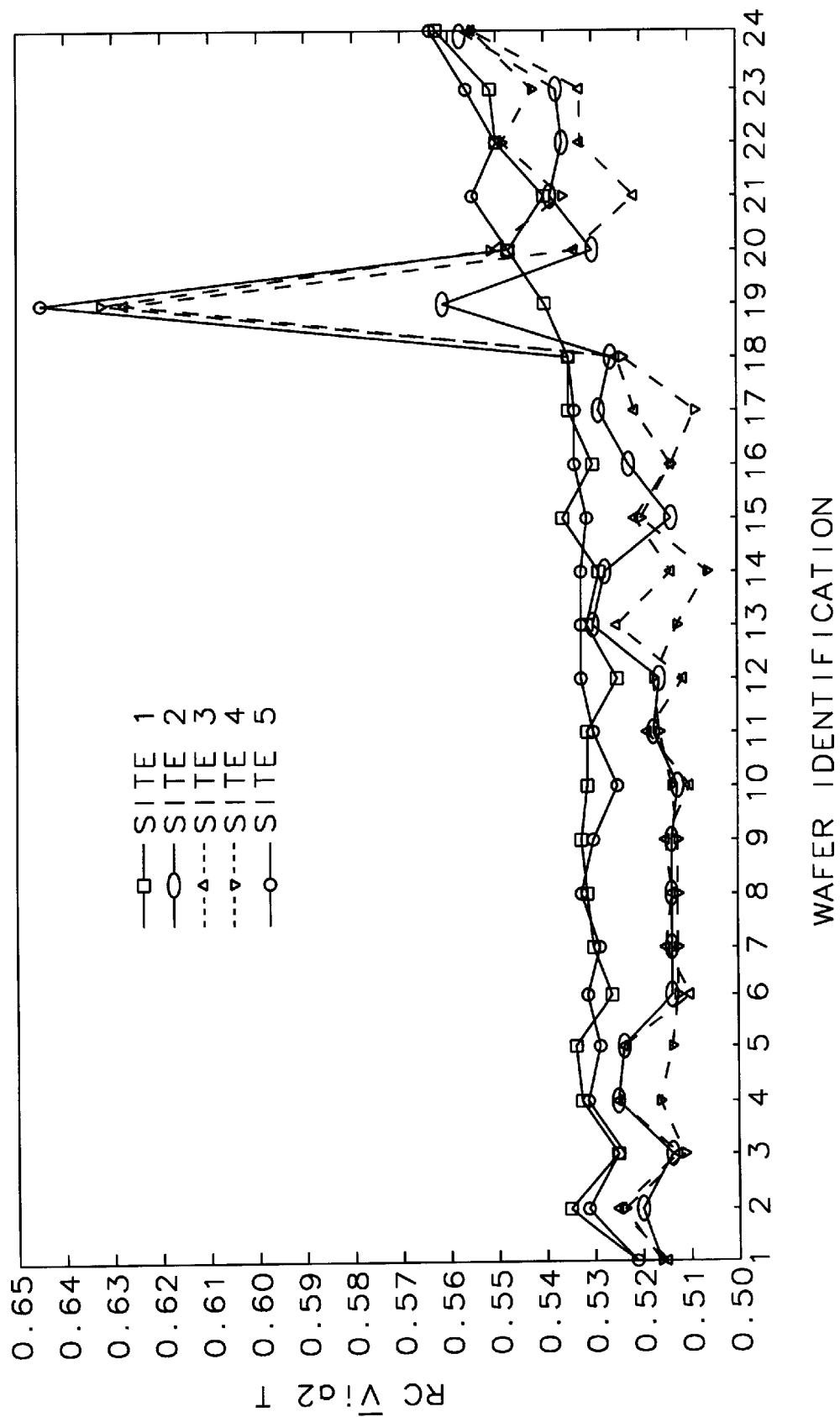
FIG. 5 shows a Rc_Via_T trend chart vs. Wafer Identification plus curves for high, and low specifications as well as the nominal value.

FIG. 5 shows a Rc_Via_T trend chart vs. Wafer Identification for SITES 1–5 plus curves for high, and low specifications as well as the nominal value.

Figure 6:
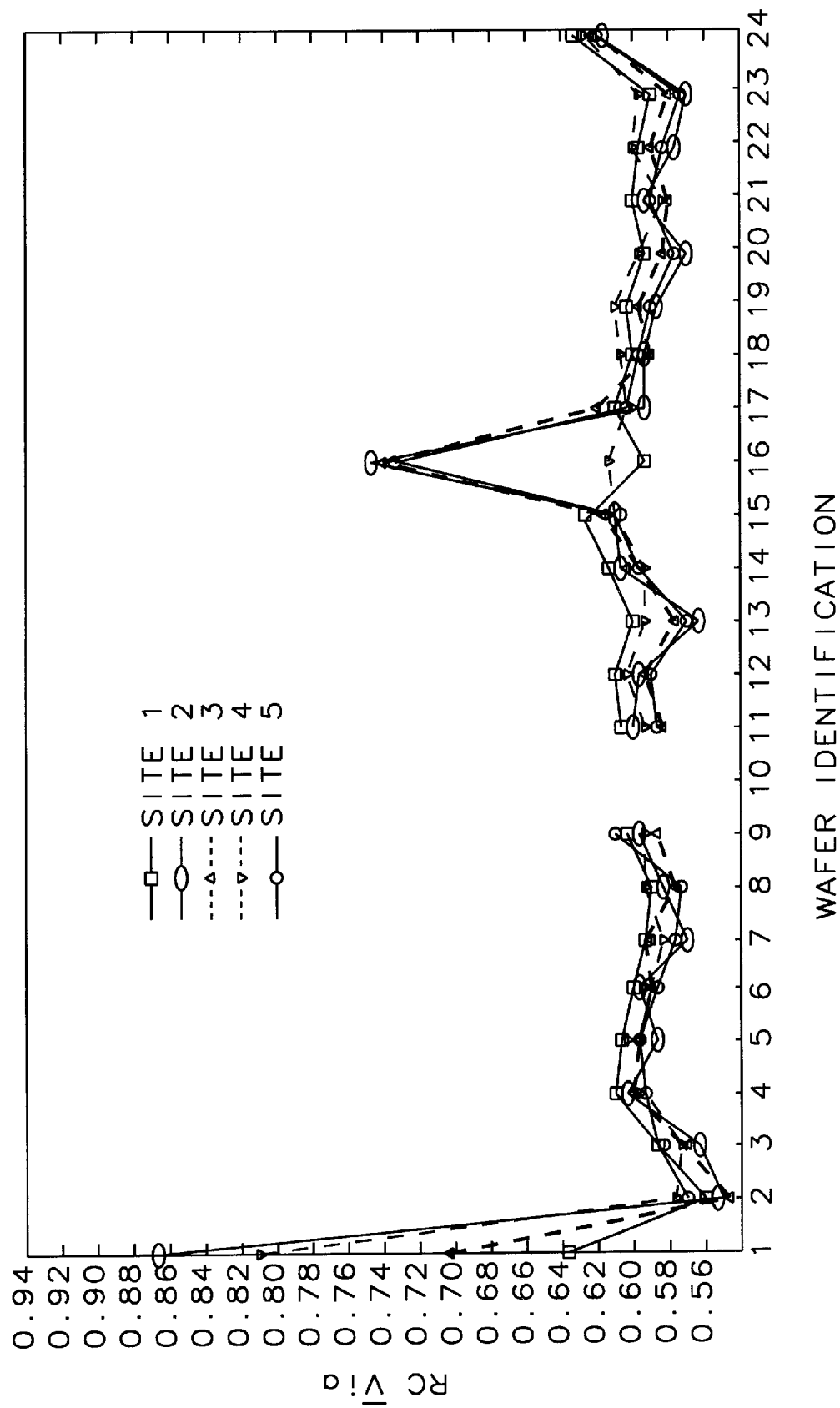
FIG. 6 shows a Rc_Via trend chart vs. Wafer Identification plus curves for high, and low specifications as well as the nominal value.

FIG. 6 shows a Rc_Via trend chart vs. Wafer Identification for SITES 1–5 plus curves for high, and low specifications as well as the nominal value.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for operating a plasma processing system comprising:

production of a plasma in a plasma processing chamber operating upon a selected workpiece, in situ detecting electromagnetic radiation of a certain wavelength generated in said plasma in said plasma processing chamber, calculating a first intensity difference of said certain wavelength from a set point of intensity, halting production of said plasma in said plasma processing chamber if said first intensity difference is outside of specifications, calculating a relative intensity difference of said certain wavelength with respect to intensities at said certain wavelength of other workpieces, and halting production of said plasma in said plasma processing chamber if an additional intensity difference is outside of specifications.

2. A method for operating a plasma processing system in accordance with claim 1 comprising:

Wafer to workpiece comparison (within lot):

$$E_k(t) = I_n(t) - I_k(t), n=1, 2, 3, \ldots, k=1, 2, \ldots, n$$

where $E_k(t)$ are the 1, 2, . . . , nth, relative intensity differences $I_n(t)$ is the monitored intensity of the nth (current) processing workpiece $I_k(t)$ are the intensities of the 1, 2, . . . , nth processing workpieces.

3. A method for operating a plasma processing system in accordance with claim 2 comprising:

performing said determination of relative intensity difference for each of a set of previous workpieces until said set of previous workpieces is exhausted.

4. A method for operating a plasma processing system in accordance with claim 1 comprising the steps as follows:

retrieving previous workpiece intensity data, retrieving current workpiece intensity data, determining the relative intensity difference by comparing the current workpiece with previous workpiece intensity data, testing whether said relative intensity difference is outside of specifications for relative intensity difference, and if YES, halting production of said plasma in said plasma processing chamber.

5. A method for operating a plasma processing system in accordance with claim 4 comprising:

performing said determination of relative intensity difference for each of a set of previous workpieces until said set of previous workpieces is exhausted.

6. A method for operating a plasma processing system in accordance with claim 1 comprising:

performing said determination of relative intensity difference for each of a set of previous workpieces until said set of previous workpieces is exhausted.

7. A method for operating a plasma processing system comprising the steps as follows:

production of a plasma in a plasma processing chamber operating upon a selected workpiece, in situ detecting electromagnetic radiation of a certain wavelength generated in said plasma in said plasma processing chamber, calculating a first intensity difference of said certain wavelength from a set point of intensity, halting production of said plasma in said plasma processing chamber if said first intensity difference is outside of specifications, retrieving intensity set point data, collecting current workpiece intensity data, determining the current workpiece vs set point intensity difference by comparing said current workpiece intensity data to said intensity set point data, testing whether said intensity difference is outside of specifications for intensity; if YES, halting production of said plasma in said plasma processing chamber; and if NO, storing said current workpiece intensity data and then retrieving previous workpiece intensity data, retrieving current workpiece intensity data, determining the relative intensity difference by comparing the current workpiece with previous workpiece intensity data, testing whether said relative intensity difference is outside of specifications for relative intensity difference, and if YES, halting production of said plasma in said plasma processing chamber.

8. Apparatus comprising a manufacturing and control system for operating a plasma processing system comprising:

a plasma processing chamber for production of a plasma in a plasma processing chamber operating upon a selected workpiece, a spectrum detector for in situ detecting electromagnetic radiation of a certain wavelength generated in said plasma in said plasma processing chamber, means for calculating a first intensity difference of said certain wavelength from a set point of intensity, means for halting production of said plasma in said plasma processing chamber if said first intensity difference is outside of specifications, calculating a relative intensity difference of said certain wavelength with respect to intensities at said certain wavelength of other workpieces, and means for halting production of said plasma in said plasma processing chamber if an additional intensity difference is outside of specifications.

9. The apparatus of claim 8 comprising:

means for providing wafer to workpiece comparison (within lot):

$$E_k(t) = I_n(t) - I_k(t), n=1, 2, 3, \ldots, k=1, 2, \ldots, n$$

where $E_k(t)$ are the 1, 2, . . . , nth, relative intensity differences $I_n(t)$ is the monitored intensity of the nth (current) processing workpiece $I_k(t)$ are the intensities of the 1, 2, . . . , nth processing workpieces.

10. A system for operating a plasma processing system in accordance with claim 9 comprising:

performing said determination of relative intensity difference for each of a set of previous workpieces until said set of previous workpieces is exhausted.

11. A system for operating a plasma processing system in accordance with claim 8 comprising the steps as follows:

retrieving previous workpiece intensity data, retrieving current workpiece intensity data, determining the relative intensity difference by comparing the current workpiece with previous workpiece intensity data, testing whether said relative intensity difference is outside of specifications for relative intensity difference, and if YES, halting production of said plasma in said plasma processing chamber.

12. A system for operating a plasma processing system in accordance with claim 11 comprising:

performing said determination of relative intensity difference for each of a set of previous workpieces until said set of previous workpieces is exhausted.

13. A system for operating a plasma processing system in accordance with claim 8 comprising:

performing said determination of relative intensity difference for each of a set of previous workpieces until said set of previous workpieces is exhausted.

14. Apparatus comprising a manufacturing and control system for operating a plasma processing system comprising:

a plasma processing chamber for production of a plasma in a plasma processing chamber operating upon a selected workpiece, a spectrum detector for in situ detecting electromagnetic radiation of a certain wavelength generated in said plasma in said plasma processing chamber, means for calculating a first intensity difference of said certain wavelength from a set point of intensity, means for halting production of said plasma in said plasma processing chamber if said first intensity difference is outside of specifications, means for retrieving intensity set point data, means for collecting current workpiece intensity data, means for determining the current workpiece vs set point intensity difference by comparing said current workpiece intensity data to said intensity set point data, means for testing whether said intensity difference is outside of specifications for intensity; if YES, halting production of said plasma in said plasma processing chamber; and if NO, storing said current workpiece intensity data and then retrieving previous workpiece intensity data, means for retrieving current workpiece intensity data, means for determining the relative intensity difference by comparing the current workpiece with previous workpiece intensity data, means for testing whether said relative intensity difference is outside of specifications for relative intensity difference, and if YES, means for halting production of said plasma in said plasma processing chamber.

* * * * *